United States Patent [19]
Huang

[11] Patent Number: 6,097,220
[45] Date of Patent: Aug. 1, 2000

[54] METHOD AND CIRCUIT FOR RECYCLING CHARGE

[75] Inventor: Sampson X. Huang, Cupertino, Calif.

[73] Assignee: Intel Corporation, Santa Clara, Calif.

[21] Appl. No.: 08/873,053

[22] Filed: Jun. 11, 1997

[51] Int. Cl.[7] .................. H03K 19/013; H03K 19/094; H03K 5/08

[52] U.S. Cl. ................... 326/88; 326/88; 326/26; 326/27; 326/17; 326/121; 326/119; 326/91; 326/92; 327/313; 327/321; 327/328

[58] Field of Search .................. 326/26, 27, 87, 326/88, 83, 91, 92, 17, 121, 119; 327/313, 321, 328, 381, 384, 389, 404, 427

[56] References Cited

U.S. PATENT DOCUMENTS

| | | | |
|---|---|---|---|
| 4,129,793 | 12/1978 | Bula et al. | 326/87 |
| 4,639,622 | 1/1987 | Goodwin et al. | 327/589 |
| 5,194,764 | 3/1993 | Yano et al. | 326/86 |
| 5,367,205 | 11/1994 | Powell | 326/27 |
| 5,371,424 | 12/1994 | Quigley et al. | 326/63 |
| 5,455,802 | 10/1995 | McClure . | |
| 5,471,415 | 11/1995 | McClure . | |
| 5,514,993 | 5/1996 | Adachi | 327/379 |
| 5,517,129 | 5/1996 | Matsui | 326/27 |
| 5,602,795 | 2/1997 | Sandhu . | |
| 5,617,043 | 4/1997 | Han et al. | 326/83 |
| 5,694,061 | 12/1997 | Morosawa et al. | 326/119 |
| 5,736,888 | 4/1998 | Sharpe-Geisler | 327/382 |

OTHER PUBLICATIONS

Bai–Sun Kong, Joo–Sun Choi, Seog–Jun Lee, Kwyro Lee; "Charge Recycling Differential Logic (CRDL) for Low Power Application", IEEE Journal of Solid State Circuits, vol. 31, No. 9, Sep. 1996, pp. 1267–1276.

*Primary Examiner*—Michael J. Tokar
*Assistant Examiner*—Vibol Tan
*Attorney, Agent, or Firm*—Howard A. Skaist

[57] ABSTRACT

Briefly, in accordance with one embodiment of the invention, an integrated circuit includes: two transistors coupled together in the integrated circuit so that upon the application of complementary voltage signals, electrical charge is substantially evenly distributed between output nodes. Briefly, in accordance with one more embodiment of the invention, an integrated circuit includes: a charge recycle circuit including two transistors. Briefly, in accordance with another embodiment of the invention, an integrated circuit includes: a charge recycle circuit including a first and second transistor coupled so as to respectively receive complementary voltage signals at the control voltage port of the first and second transistors. The transistors have a threshold voltage level different from the threshold voltage level of other transistors coupled to the charge recycle circuit. Briefly, in accordance with still another embodiment of the invention, a method of recycling charge includes: applying complementary voltage signals to first and second transistors coupled in an integrated circuit so as to substantially evenly distribute electrical charge between the output nodes.

3 Claims, 4 Drawing Sheets

METHOD AND CIRCUIT FOR RECYCLING CHARGE

BACKGROUND OF THE INVENTION

1. Field of the Invention

The present invention relates to digital circuits and, more particularly to a method and circuit for recycling charge in digital circuits.

2. Background Information

For integrated circuits and, in particular, integrated circuits including digital electronic circuits, the frequency of operation and integrated circuit transistor count for such circuits continues to increase as semiconductor technology continues to advance. As a result, the power consumption of an integrated circuit also continues to increase. However, reducing the power consumption of an integrated circuit is desirable, especially for mobile or portable applications, such as laptop computers, cellular telephones and the like.

Typically, power consumption has been reduced by reducing the power supply voltage level. Reducing the power supply voltage level has been beneficial because power consumption is proportional to the square of the voltage level. However, a lower limit exists on the ability to reduce the supply voltage level due at least partially to transistor threshold voltage levels. Therefore, another technique to reduce power consumption would be desirable.

A charge recycling differential logic circuit that has been developed is one example to reduce power consumption. See, for example, "Charge Recycling Differential Logic (CRDL) for Low Power Application" by Bai-Sun Kong, Joo-Sun Choi, Seog-Jun Lee, and Kwyro Lee, appearing in *IEEE Journal of Solid-State Circuits*, Vol. 31, No. 9, September 1996, herein incorporated by reference. In this article, a technique is described in which digital signals are converted into differential signals and a precharge clock phase is employed to redistribute charge in the circuit. During an evaluation clock phase, a sense amplifier is employed and then generates the digital output signals. This approach reduces power consumption compared to domino logic circuit approaches. However, this approach also consumes more power than static complementary metal-oxide-semiconductor (CMOS) circuits. In particular, the interconnect loading is doubled in comparison with a static CMOS circuit because the digital signals are converted to differential pair signals. Likewise, additional gates are employed for overhead and these additional gates consume additional power.

A need, therefore, exists for a circuit or technique for reducing power consumption relative to static CMOS circuits.

SUMMARY OF THE INVENTION

Briefly, in accordance with one embodiment of the invention, an integrated circuit includes: two transistors coupled together in the integrated circuit so that upon the application of complementary voltage signals, electrical charge is substantially evenly distributed between output nodes.

Briefly, in accordance with one more embodiment of the invention, an integrated circuit includes: a charge recycle circuit including two transistors.

Briefly, in accordance with another embodiment of the invention, an integrated circuit includes: a charge recycle circuit including a first and second transistor coupled so as to respectively receive complementary voltage signals at the control voltage port of the first and second transistors. The transistors have a threshold voltage level different from the threshold voltage level of other transistors coupled to the charge recycle circuit.

Briefly, in accordance with still another embodiment of the invention, a method of recycling charge includes: applying complementary voltage signals to first and second transistors coupled in an integrated circuit so as to substantially evenly distribute electrical charge between output nodes.

BRIEF DESCRIPTION OF THE DRAWINGS

The subject matter regarded as the invention is particularly pointed out and distinctly claimed in the concluding portion of this specification. The invention, however, both as to organization, and method of operation, together with objects, features, and advantages thereof, may best be understood by reference to the following detailed description, when read with the accompanying drawings in which:

DETAILED DESCRIPTION OF THE INVENTION

In the following detailed description, specific details are set forth in order to provide a thorough understanding of the invention. However, it will be understood by those skilled in the relevant art that the present invention may be practiced without these specific details. In other instances, well known methods, procedures, components, and circuits have not been described in detail so as not to obscure the present invention.

Figure 1:
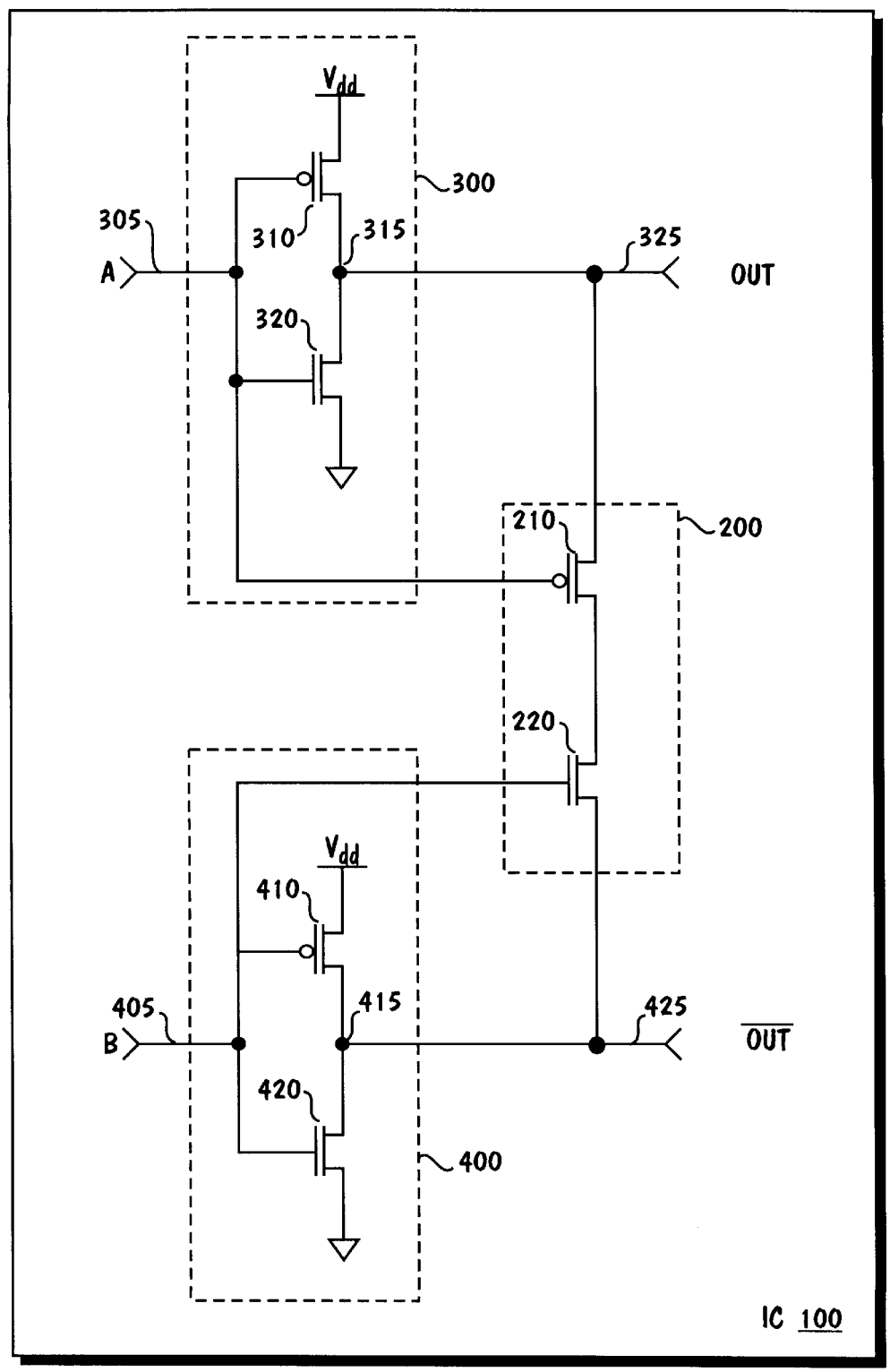
FIG. 1 is a circuit diagram illustrating an embodiment of a circuit for recycling charge in accordance with the present invention.

FIG. 1 is a circuit diagram illustrating an embodiment 100 of a circuit for recycling charge in accordance with the present invention. Although the invention is not limited in scope in this respect, embodiment 100 is illustrated as embodied on an integrated circuit (IC) chip. Embodiment 100 includes charge recycle circuit 200 and two complementary metal-oxide-semiconductor (CMOS) inverters 300 and 400. As illustrated, for this particular embodiment, charge recycle circuit 200 includes two transistors, 210 and 220, coupled together so that upon the application of complementary voltage signals, electrical charge is distributed substantially evenly between two output nodes, nodes 315 and 415. This operation will be explained in greater detail hereinafter with reference to FIGS. 2 and 3.

In this particular embodiment, charge recycle circuit 200 includes a first and second input port, 305 and 405, and a first and second output port, 325 and 425. Likewise, although charge recycle circuit 200 includes two N-type metal-oxide-semiconductor (NMOS) transistors, the invention is not limited in scope in this respect. For example, a P-type metal-oxide-semiconductor (PMOS) transistor may alternatively be employed.

For the embodiment illustrated in FIG. 1, the two input ports of charge recycle circuit 200 are respectively coupled to the input ports for first CMOS inverter 300 and second CMOS inverter 400. Likewise, the output ports of charge recycle circuit 200 are respectively coupled to the output ports for first CMOS inverter 300 and second CMOS inverter 400.

In this particular embodiment, inverters 300 and 400 are coupled in the integrated circuit so that the respective input ports of these inverters receive complementary voltage signals. Therefore, if a high voltage signal is applied to the input port for inverter 300, designated A in FIG. 1, then a low signal is applied to the input port of inverter 400, designated B in FIG. 1. Therefore, complementary voltage signals are likewise applied to the input ports of charge recycle circuit 200 and the output ports of inverter 300 and 400 produce complementary voltage signals. In this context, the term complementary voltage signals refers to voltage signals having voltage signal levels that correspond to complementary binary logic states, although the invention is not limited in scope to a particular convention in this regard.

Figure 2:
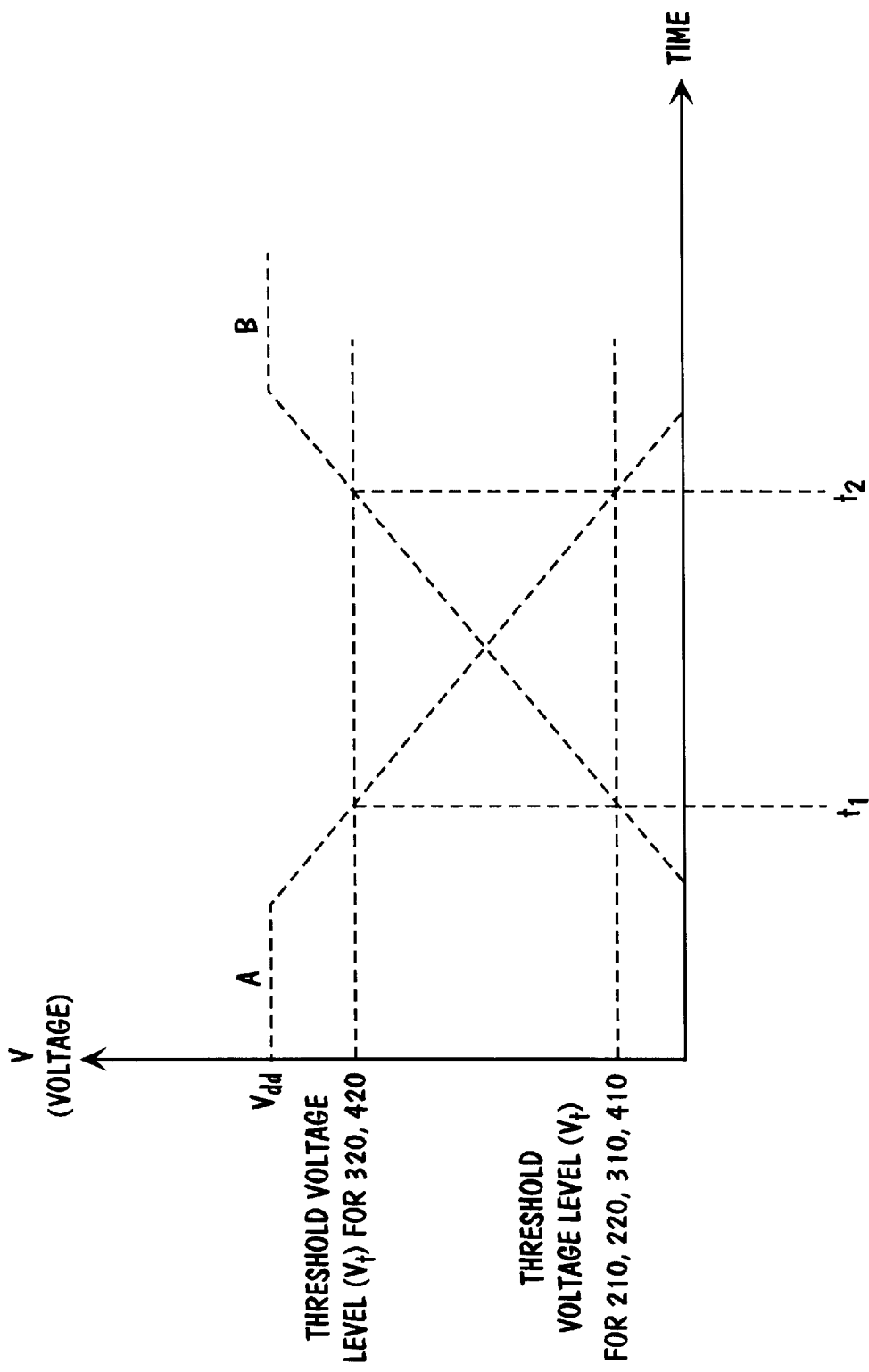
FIG. 2 is a plot illustrating complementary input voltage signals that may be applied to the embodiment of FIG. 1.
Figure 3:
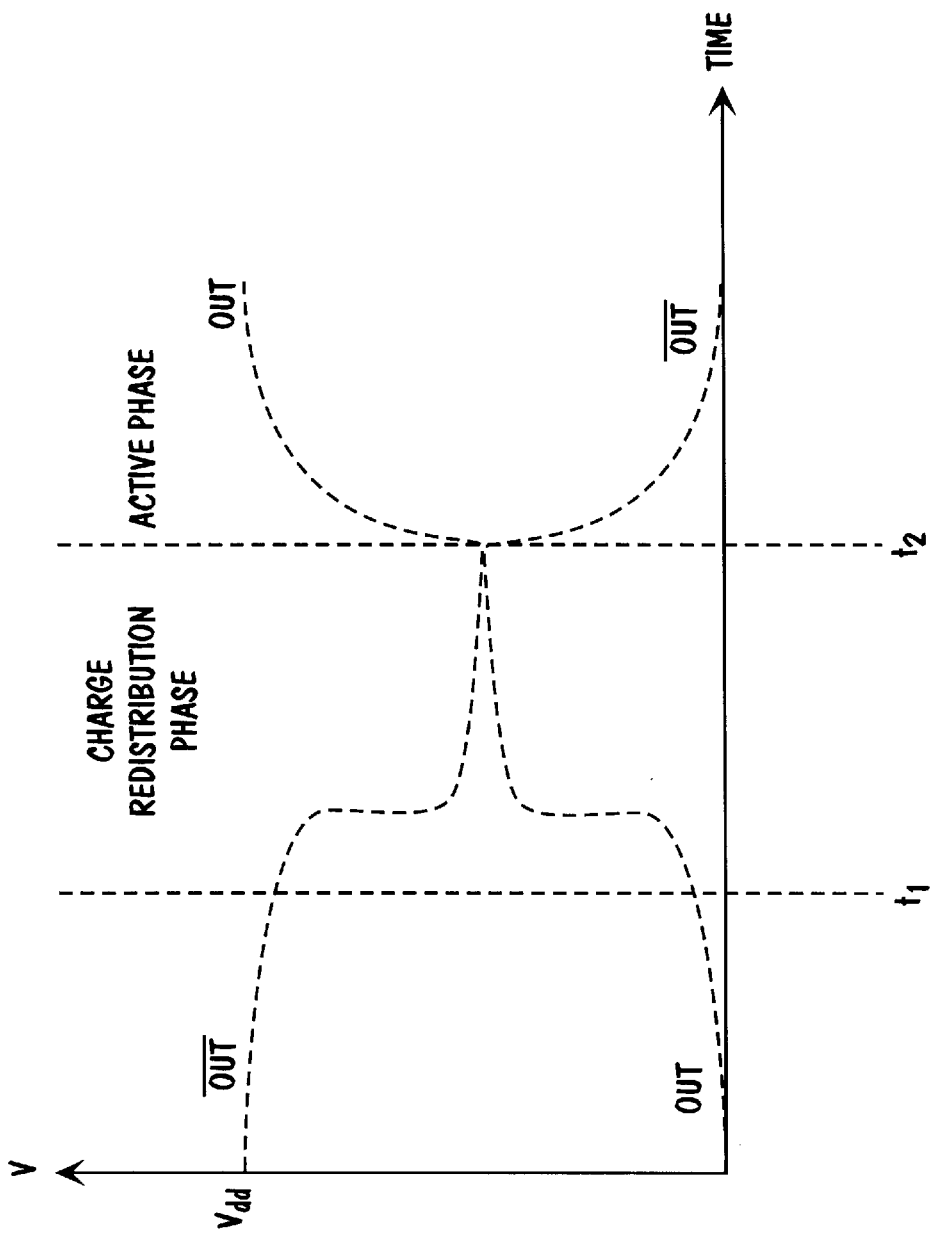
FIG. 3 is a plot illustrating the output voltage signals produced by the embodiment of FIG. 1.

The operation of this particular embodiment of a circuit for recycling charge may be understood with reference to FIGS. 2 and 3. FIG. 2 is a plot illustrating complementary voltage signals applied to the input ports of inverters 300 and 400 over a particular time period. Although the invention is not limited in scope in this respect, in this particular embodiment, a high signal corresponds to a voltage signal level $V_{dd}$ whereas a low signal corresponds to ground. Therefore, as illustrated in FIG. 2, initially a high signal is applied to inverter 300 whereas a low signal is applied to inverter 400. As illustrated, over time the voltage signal applied to inverter 300 decreases while the voltage signal applied to inverter 400 increases. Eventually, voltage signal level $V_{dd}$ is applied to inverter 400 whereas ground is the voltage signal level of the input port of inverter 300.

The impact of these voltage signals on the operation of the embodiment illustrated in FIG. 1 relates to the threshold voltage levels for the transistors of this particular embodiment. As illustrated in FIG. 2, as the voltage signal level applied to input port A decreases, eventually, it falls below the threshold voltage level for transistor 320. Likewise, as the voltage signal level applied to input port B increases, eventually it exceeds the threshold voltage level for transistor 410 and transistor 220. In FIG. 2, this is indicated as occurring at time $t_1$. FIG. 3 illustrates the voltage signal levels at the output ports designated OUT and, the complement of OUT( OUT_bar). Therefore, based on the previous discussion, at time $t_1$, transistors 320 and 410 turn off, whereas previously they had been activated. Also, transistor 220 is turned on. As a result, the electrical charge on the output nodes 315 and 415 of inverters 300 and 400 will be substantially evenly distributed or redistributed through transistors 210 and 220 of charge recycle circuit 200. Between times $t_1$ and $t_2$, a sufficient voltage signal level is applied to transistors 210 and 220 so that these transistors are conducting and, therefore, electrical charge on the output nodes of inverters 300 and 400 is substantially evenly distributed through transistors 210 and 220. This charge distribution is illustrated in FIG. 3. At time $t_2$, the voltage signal level applied to port A reaches the threshold voltage level of transistors 210 and 310 and turns transistor 210 off and transistor 310 on; the voltage signal level applied to port B reaches the threshold voltage level of transistor 420 and turns it on. Therefore, after time $t_2$, charge recycle circuit 200 is turned off. Transistors 310 and 420 are turned on to actively drive the complementary output nodes OUT and OUT_bar to a high state and low state, respectively. More specifically, after the charge has been redistributed, as illustrated in FIGS. 2 and 3, voltage signal levels for the voltage signals applied to the input ports of inverter 300 and inverter 400 occur at a level so that the output ports of these inverters, are, respectively, actively pulled up to a first voltage level, such as the $V_{dd}$, and down to a second voltage level, such as ground. For example, in this case the voltage signal applied to input port B achieves a voltage signal level so that transistor 420 is on and, therefore, the output port of inverter 400 is pulled down to ground. Likewise, the voltage signal applied to input port A achieves a voltage signal level so that transistor 310 is conducting and, therefore, the output port of inverter 300 is pulled up to the voltage signal level $V_{dd}$. One reason charge accumulates at output nodes 315 and 415 relates to the junction capacitance associated with the nodes. Likewise, where a node is coupled so that the voltage signal at the node may be applied to a gate of a device being driven by the voltage signal, for example, capacitance may also be associated with the gate.

One aspect of this particular embodiment of a circuit for recycling charge is that complementary voltage signals are employed. Examples, without limitation, of such signals in an integrated circuit, such as a microprocessor, for example, include a clock signal and the complement of the clock signal, an address signal, and the complement of the address signal, a reset signal and the complement of the reset signal, or a clear signal and the complement of the clear signal. The invention, of course, is not restricted in scope with respect to these particular complementary voltage signals.

Typically, such complementary signals are heavily loaded. Therefore, reducing power for these complementary signals may reduce the power consumption of an integrated circuit employing an embodiment in accordance with the current invention. As the previous description illustrates, in this embodiment, the complementary signals are paired and they switch in opposing directions in terms of voltage signal levels. Therefore, for this particular embodiment, for example, in a static state, one node, such as node 315 or 415 coupled to an output port, is charged to a first voltage signal level, such as the power supply voltage $V_{dd}$, and another node, either 315 or 415, also coupled to an output port, is charged, or in this case discharged, to a second voltage signal level, in this particular embodiment, to ground. At the beginning of the signal switching, such as illustrated in FIG. 2, the charge recycle circuit conducts between the two complementary nodes so the electrical charge is redistributed between the two nodes to reach roughly one half of $V_{dd}$ in terms of voltage signal level. After this redistribution, the drivers, such as transistors 310, 320, 410 and 420 in this particular embodiment, are selectively turned on to pull one of the nodes up to a first voltage signal level, $V_{dd}$, and the other down to a second voltage signal level, ground. In the first half of the switching process, charge is recycled for the nodes to switch to approximately the mid-point voltage signal level. Of course, at this point in the process, the nodes are not complementary. Then, the drivers are employed to complete the switching, as previously described. As a result, approximately 50% of the charge that might be consumed is saved or recycled by this particular embodiment in accordance with the invention. Likewise, this embodiment of the invention employs little overhead in terms of clock drivers or other forms of circuitry.

As previously described, for the drivers to be activated after charge redistribution, the threshold voltage level for transistors 320 and 420, in this particular embodiment, differ from other NMOS transistors employed in the integrated circuit and in this embodiment are higher. Likewise, the threshold voltage level for transistors 310 and 410 differ from and are lower than other PMOS transistors that may be employed. During fabrication, this may result in an additional fabrication step, such as an additional masking step, in order to ensure that the transistors are sufficiently doped to provide this difference in voltage signal levels.

Figure 4:
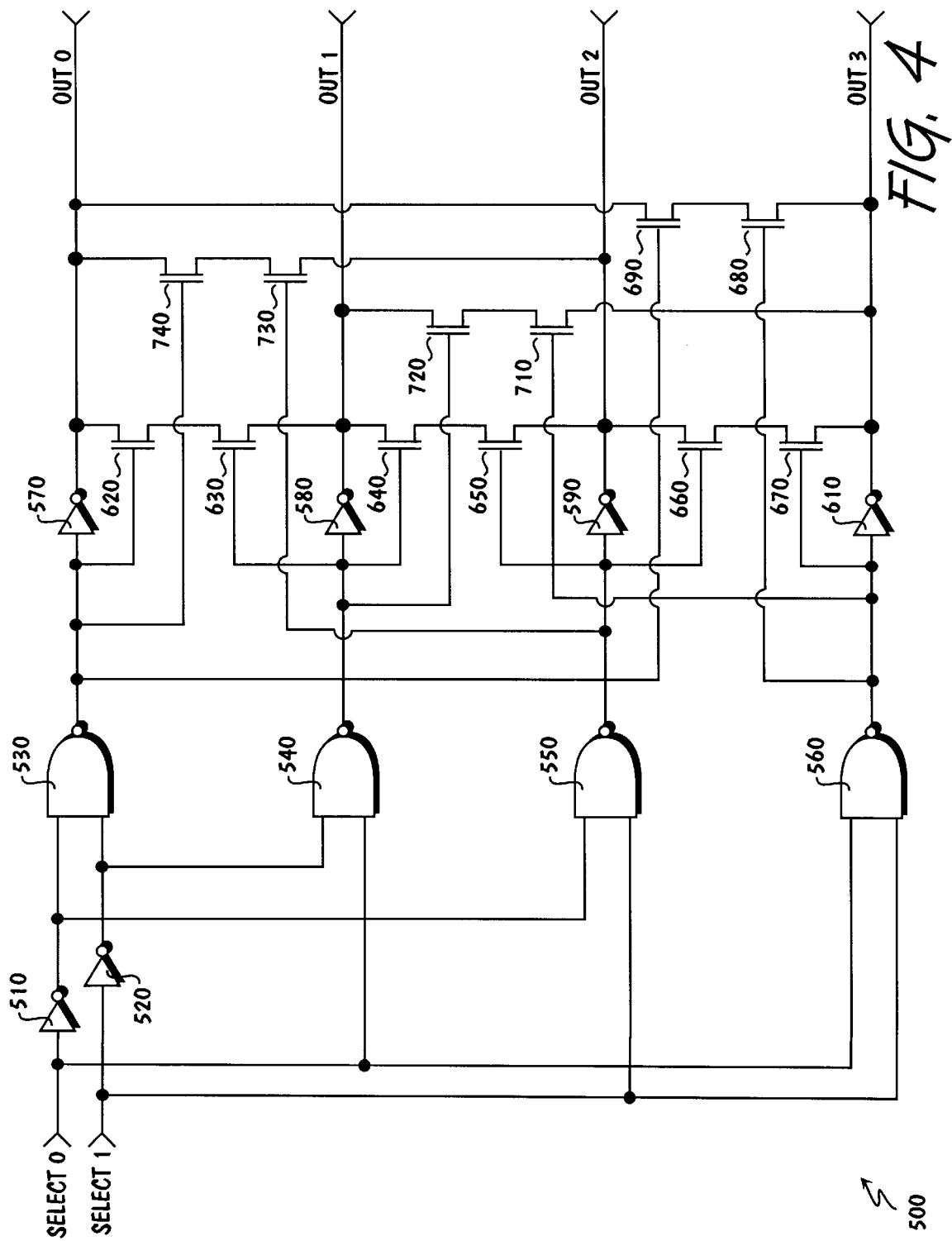
FIG. 4 is a circuit diagram illustrating another embodiment of a circuit for recycling charge in accordance with the present invention.
Figure 1:
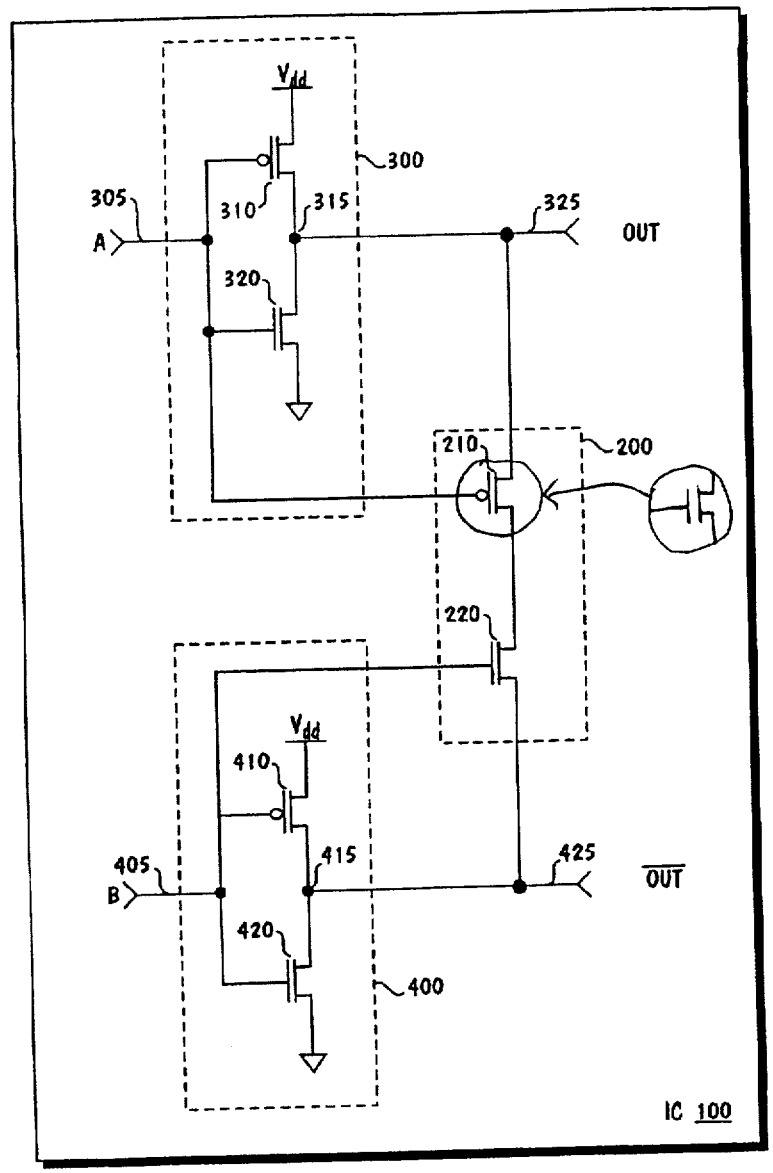

FIG. 4 is a circuit diagram illustrating another embodiment of a circuit for recycling charge in accordance with the present invention. This particular embodiment illustrates a two-to-four decoder employing charge recycling in accordance with the present invention. In this particular embodiment, as illustrated in FIG. 4, inverters 510, 520, 570, 580, 590 and 610 and NAND gates 530, 540, 550, and 560 are coupled in a circuit configuration to provide a decoder circuit. However, in this particular embodiment, circuits for recycling charge couple to output nodes of the decoder. Therefore, with four output nodes, six circuits for recycling charge are employed, coupling each respective pair of the four output nodes. In this particular embodiment, the circuits for recycling charge each comprise two transistors, such as previously illustrated in conjunction with FIG. 1. Likewise, the signals employed to drive the decoder are likewise employed to drive the circuits for recycling charge. Furthermore, different transistor threshold voltage levels, as previously discussed, are likewise employed in this particular embodiment in accordance with the present invention. Therefore, the electrical charge to produce a high signal at one of the output nodes of embodiment 500 may be substantially evenly distributed across the two transistors coupling that output node to the next output node to produce a high signal. As a result, approximately half of the charge is recycled, as in the manner previously described. After the electrical charge is redistributed, as previously described, one of the transistors is pulled high by drivers, while the other transistor is pulled low.

An embodiment of a method for recycling charge in accordance with the invention includes the following. Complementary voltage signals may be applied to a first and second transistor coupled in an integrated circuit so as to substantially evenly distribute electrical charge between output nodes, as previously described with respect to FIG. 1. The complementary voltage signals are applied to the control voltage port of the transistors, the gate in this embodiment. The voltage signal level of one of the output nodes may be increased to a first voltage signal level, such as the voltage signal level of the power supply, $V_{dd}$ in this embodiment. Likewise, the voltage signal level of another of the output nodes may be decreased to a second voltage signal level, such as ground in this embodiment. The signals applied to actively increase and decrease the voltage signal level of the output nodes also comprise complementary voltage signals in this embodiment.

Likewise, this particular embodiment of a method of recycling charge in accordance with the invention may be applied to a variety of complementary voltage signals such as address signals, clock signals, clear signals, and reset signals, for example. Likewise, it may be applied to charge recycle circuits employed in a variety of digital circuits, such as an inverter or decoder circuit, as previously described.

While certain features of the invention have been illustrated as described herein, many modifications, substitutions, changes and equivalents will now occur to those skilled in the art. For example, an embodiment in accordance with the invention may be implemented with any bidirectional transistor, such as an MOS transistor, as previously described. It is, therefore, to be understood that the appended claims are intended to cover all such modifications and changes as fall within the true spirit of the invention.

What is claimed is:

1. An integrated circuit comprising:

a charge recycle circuit, said charge recycle circuit including a first and second input port and a first and second output port; wherein said charge recycle circuit includes two transistors coupled to said input and output ports; wherein said charge recycle circuit is coupled to a first and a second complementary CMOS inverter circuit, said first and second complementary inverter circuit being coupled in said integrated circuit so as to receive complementary input signals; said respective output ports of said first and second complementary inverter circuit being respectively coupled to said first and second output ports of said charge recycle circuit; said respective first and second input ports of said charge recycle circuit being respectively coupled to said input ports of said first and second complementary inverter circuit.

2. An integrated circuit comprising:

a charge recycle circuit, said charge recycle circuit including a first and second input port and a first and second output port; wherein said charge recycle circuit includes two transistors coupled to said input and output ports; wherein said two transistors are coupled together; said charge recycle circuit being coupled so that said first input port and said second input port receive complementary signals, said first output port and said second output port being respectively coupled to respective output ports of a first and second complementary CMOS inverter circuit; said complementary CMOS inverter circuits respectively also being coupled so that a first input port and a second input port of said complementary inverter circuits receive said complementary signals.

3. The integrated circuit of claim 2, wherein the threshold voltage levels of said two transistors of said charge recycle circuit differ from the threshold voltage levels of the transistors of said complementary CMOS inverter circuits.

* * * * *

UNITED STATES PATENT AND TRADEMARK OFFICE
CERTIFICATE OF CORRECTION

PATENT NO.    : 6,097,220
DATED         : August 1, 2000
INVENTOR(S)   : Huang.

It is certified that error appears in the above-identified patent and that said Letters Patent is hereby corrected as shown below:

In figure 1, transistor 210 should be shown as an N-type transistor.

Signed and Sealed this

Fifteenth Day of May, 2001

Attest:

NICHOLAS P. GODICI

Attesting Officer

Acting Director of the United States Patent and Trademark Office